United States Patent [19]
Nelson

[11] 3,972,061
[45] July 27, 1976

[54] MONOLITHIC LATERAL S.C.R. HAVING REDUCED "ON" RESISTANCE

[75] Inventor: Carl T. Nelson, Sunnyvale, Calif.

[73] Assignee: National Semiconductor Corporation, Santa Clara, Calif.

[22] Filed: Aug. 6, 1975

[21] Appl. No.: 602,378

Related U.S. Application Data

[63] Continuation of Ser. No. 511,289, Oct. 2, 1974, abandoned, which is a continuation of Ser. No. 385,348, Aug. 3, 1973, abandoned.

[52] U.S. Cl. ................................. 357/38; 357/20; 357/48
[51] Int. Cl.² ..................................... H01L 29/74
[58] Field of Search ............... 357/20, 34, 38, 48

[56] References Cited
UNITED STATES PATENTS

| | | |
|---|---|---|
| 3,667,006 | 5/1972 | Ruegg ................................. 357/34 |
| 3,725,683 | 4/1973 | Andersen ............................ 357/38 |

*Primary Examiner*—Andrew J. James
*Assistant Examiner*—Joseph E. Clawson, Jr.
*Attorney, Agent, or Firm*—Lowhurst & Aine

[57] ABSTRACT

In a monolithic lateral silicon controlled rectifier structure suitable for integrated circuit application, laterally spaced P type conductivity regions are embedded in an epitaxial N type layer for defining lateral anode and cathode regions thereof. A subcollector layer of N+ conductivity is disposed underlying the anode, cathode and gate regions of the lateral semiconductive structure. The anode region includes a P+ dependent zone extending down through the N type conductivity region to the N+ subcollector layer for reducing the "on" resistance of the silicon controlled rectifier structure. In addition, the N+ subcollector region is preferably a heavily doped region for further reduction of series resistance.

11 Claims, 3 Drawing Figures

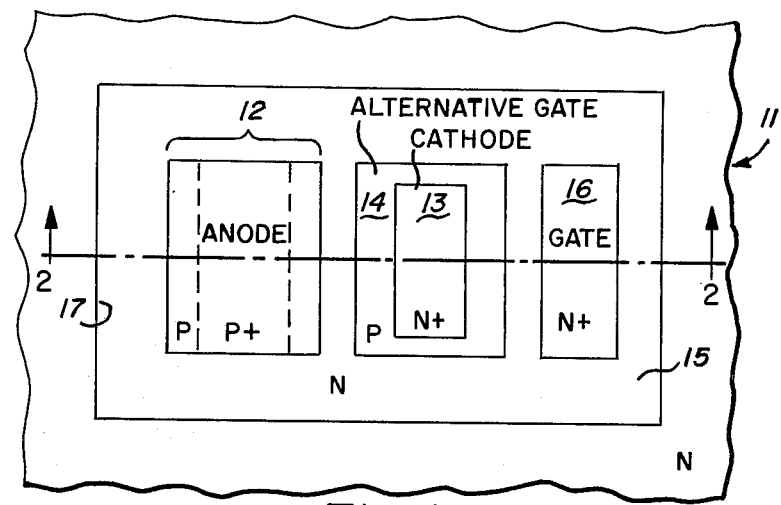
Fig_1
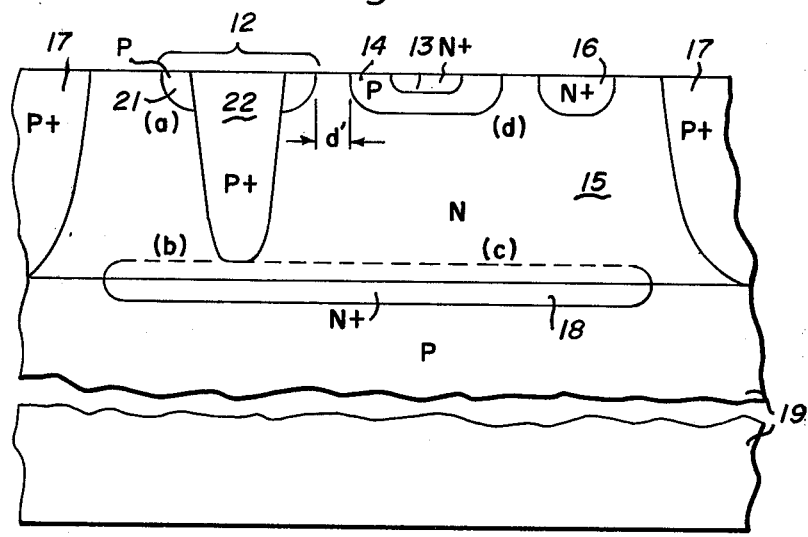
Fig_2
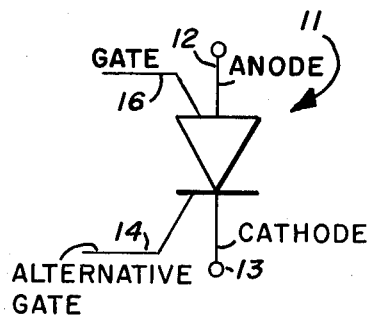
Fig_3

MONOLITHIC LATERAL S.C.R. HAVING REDUCED "ON" RESISTANCE

BACKGROUND OF THE INVENTION

This is a continuation of application Ser. No. 511,289 now abandoned, filed Oct. 2, 1974; which in turn is a continuation of Ser. No. 385,348, filed Aug. 3, 1973, abandoned.

The present invention relates in general to monolithic lateral type silicon controlled rectifiers and more particularly to such a rectifier structure having reduced on resistance, whereby the power that can be switched by the silicon controlled rectifier for a given area of the lateral device is increased.

DESCRIPTION OF THE PRIOR ART

Heretofore, monolithic lateral SCR's (silicon controlled rectifiers) have been fabricated wherein first and second P type conductivity regions and a first N type conductivity region have been diffused into the surface of an N type epitaxial layer to define the P, N, P, N structure of a lateral SCR structure. In addition, an N+ subcollector layer was disposed underlying the N type epitaxial layer. The N+ subcollector layer having a conductivity of 20–50 $\Omega/\square$ was formed by a single diffusion into the P type substrate.

In the prior art device, three factors, in their order of importance, contributed to the unwanted on resistance of the lateral SCR structure. The largest factor was the resistance encountered through the vertical path between the anode region and the underlying N+ subcollector layer. The distance between the anode diffusion and the subcollector region was typically 5 to 20 microns and accounted for approximately 60% of the on resistance of the device. The second contribution to the on resistance was the lateral resistance of the N+ subcollector region. In a typical device of the prior art, this amounted to approximately 30% of the on resistance of the device. The third region introducing resistance into the semi-conductive device was the vertical path from the N+ subcollector region to the overlaying N+ cathode diffusion. This normally constituted approximately 10% of the on resistance of the device. Thus, a typical prior art lateral SCR having an area of 60 by 80 mils had an on resistance of approximately 1 ohm. It would be desirable to substantially reduce the on resistance to an amount which would be one-third to one-fifth or less of that of the prior art structure.

SUMMARY OF THE PRESENT INVENTION

The principal object of the present invention is the provision of an improved lateral type silicon controlled rectifier structure particularly suitable for use in monolithic integrated circuits.

In one feature of the present invention, the anode region of a P, N, P, and N lateral silicon controlled rectifier structure includes a dependent P+ semiconductive region extending down into an N type conductivity region of the device toward an N+ type conductivity subcollector layer, whereby the on resistance of the lateral SCR structure is substantially reduced.

In another feature of the present invention the dependent P+ region of the anode region extends down through an intervening N type layer of the P, N, P, and N structure to the N+ subcollector layer for reducing the on resistance of the lateral silicon controlled rectifier.

In another feature of the present invention, the N+ subcollector layer is made of a high conductivity falling within the range of 5–20 $\Omega/\square$ for reducing the lateral resistance of the subcollector layer, thereby reducing the on resistance of the silicon controlled rectifier.

In another feature of the present invention, the anode of a lateral type P, N, P, and N silicon controlled rectifier includes an anode structure having an upper portion of P type conductivity and a dependent region of P+ conductivity penetrating the underlying N region to the N+ subcollector layer, whereby the upper P type conductivity portion precisely defines the lateral distance between the anode and the second P type region of the device.

BRIEF DESCRIPTION OF THE DRAWINGS

Other features and advantages of the present invention will become apparent upon a perusal of the following specification taken in connection with the accompanying drawings wherein:

FIG. 1 is a plan view of a portion of a monolithic integrated circuit depicting the structure of a lateral silicon controlled rectifier of the present invention, FIG. 2 is a sectional view through the structure of FIG. 1 taken along line 2—2 in the direction of the arrows, and FIG. 3 is a schematic equivalent circuit for the lateral silicon controlled rectifier device of FIG. 1 and 2,

DESCRIPTION OF THE PREFERRED EMBODIMENTS

Referring now to FIGS. 1 and 2, there is shown a lateral type silicon controlled rectifier useful in monolithic type integrated circuitry. The silicon controlled rectifier 11 includes laterally spaced P type anode region 12, N+ cathode region 13, and an alternative P type gate region 14 embedded in an epitaxial N type layer 15. An N+ type conductivity region 16 is provided for making electrical contact to the N region 15 which forms the gate structure. The N+ gate contact region 16 can be located in any convenient place for making contact to the N region 15.

A P+ isolation diffusion zone 17 circumscribes the conductivity regions 13–16 for isolating the lateral silicon controlled rectifier circuit portion 11 from other integrated circuit elements such as transistors and the like of the remaining portion of the monolithic integrated circuit, not shown.

An N+ subcollector layer 18 is disposed underlying the electrode regions 12–16. The subcollector layer 18 is formed by diffusion into a P type silicon substrate wafer 19. In a typical example, the P type substrate wafer 19 has a thickness as of 0.010 inch, a conductivity within the range of 1–10 ohm centimeters, and is doped with a conventional acceptor or P type dopant such as boron.

The N+ subcollector layer 18 is formed by diffusion into the surface layer of the substrate 19. In a typical example, the N+ subcollector layer 18 is created by a pre-deposition wherein the surface of the substrate wafer 19 is coated with a suitable N+ dopant such as arsenic or antimony and then heated in a furnace to diffuse the N type dopant into the substrate layer 19 to form the N+ sub-collector layer 18. The result is an N+ subcollector layer 18 fomred by diffusion having a depth of 5 to 25 microns and with a concentration of N type dopant increasing toward the top or outer surface of the substrate member 19. In a typical example, the double doped subcollector layer 18 has a conductivity within the range of 5 to 20 ohms per square.

The epitaxial N layer 15 is grown over the subcollector layer 18 to a thickness as of 5 to 30 microns and is doped with conventional N type dopant as of phosphorus or arsenic to a conductivity falling within the range of 0.5 to 5 ohm centimeters.

The anode region 12 includes an upper surface layer portion 21 or P type conductivity material. In a typical example, the upper portion 21 of anode 12 is formed by diffusion of P type dopant such as boron to a depth of between 1 and 10 microns to define an upper region having a conductivity falling within the range of 20 to 400 ohms per square.

A p+ region 22 is formed by diffusion in the same manner as the P+ isolation diffusion ring 17. More particularly, the P+ region 22 is formed by the conventional P+ isolation diffusion down into the underlying epitaxial N layer 15 and preferably all the way through to the N+ subcollector layer 18. The P+ region 22 has a conductivity as of 2–6 ohms per square.

The purpose of the dependent P+ diffusion region 22 is to reduce the resistance between the upper anode region 21 and the sub-collector region 18 which, in the prior art, constituted approximately 60% of the on resistance of the lateral type silicon controlled rectifier structures. In other words, the purpose of the P+ dependent diffusion 22 is to reduce the resistance between points $a$ and $b$, i.e. the resistance in the vertical direction from the anode to the subcollector 18. The dependent diffusion 22 serves to reduce the prior art value of this resistance to a factor which is approximately one-tenth of the original resistance, i.e. one-tenth of 60% of the on resistance or to a factor or approximately 6% of the total on resistance of the prior art SCR.

Likewise, the high conductivity diffusion of the subcollector layer 18 serves to further reduce the on resistance of the silicon controlled rectifier of the present invention. Highly doped layer 18 reduces the resistance from $b$ to $c$ to approximately one-half of the value of 30% which was attributable to the prior art N+ subcollector layer 18. Thus, the high conductivity of the N+ subcollector layer reduces the resistance in the lateral direction through the subcollector layer 18 to approximately 15% of the total on resistance of the prior art device. The resistance from the subcollector 18 to the alternate gate region 14 and cathode 13 remains the same in the structure of the present invention as was encountered in the prior art. In the prior art this value of on resistance was approximately 10% of the total on resistance of the silicon controlled rectifier device.

Thus, the dependent P+ diffusion region 22 and the high conductivity of the subcollector layer 18 serves to reduce the on resistance of the SCR of the present invention to approximately 31% of the on resistance of the prior art device.

The alternate gate region 14 is a diffusion produced at the same time as the upper P type portion of the anode diffusion such that the intervening thickness of N type layer $d'$ can be precisely controlled for controlling current gain. In a typical example, $d'$ is selected to be 5 microns. The purpose of the upper diffusion 21 is to precisely control $d'$. The gate region 14 is of the same material as the upper portion 21 of the anode 12 and comprises a P type doped diffused layer without 1 to 5 microns deep having a conductivity falling within the range of 20–400 ohms per square.

The cathode diffused region 13 is a conventional N+ emitter diffusion having a depth falling within the range of 0.5 to 8.0 microns doped with a conventional dopant such as phosphorus to a conductivity falling within the range of 1 to 10 ohms per square.

The gate contact diffusion region 16 is formed at the same time as the cathode diffusion region 13 to a depth as of 0.5 to 8.0 microns doped with phosphorus to a conductivity falling within the range of 1 to 10 ohms per square.

Metal contacts are deposited overlaying the active regions, 12, 13, 14 and 16 for making electrical connection thereto in the conventional manner. The conventional electrodes and their intervening insulative material, as of silicon dioxide are not shown.

The equivalent circuit for the structure of FIGS. 1 and 2 is shown in FIG. 3. The structure 11 includes the anode and cathode regions 12 and 13, respectively. The gate region 16 is the preferred method for gating the structure. However, an alternative gate 14 is also possible. However, there is an advantage to making the electrical connection to gate 16 in that the gate 16 may be placed in any convenient location on the epitaxial layer 15 for making electrical connection thereto.

In a typical example of the structure of FIGS. 1 and 2, a plurality of the electrode diffusions 12–14 are arrayed parallel to each other in the manner shown in FIG. 1 for increasing the area of the lateral SCR structure and thereby decreasing the on resistance of the device for increasing its power handling capability. As previously pointed out, the gate electrode region 16 may be located anywhere within the region bounded by the isolation ring 17 for making electrical contact to the N layer 15.

The advantage of the lateral SCR of the present invention is that by reducing the on resistance it greatly reduces the power dissipation at relatively high current levels as of greater than 1 amp. In the prior art lateral SCR's the series resistance was too high for operation above 1 ampere for a reasonable area allocable to an SCR device within an integrated monolithic bi-polar circuit. However, by reducing the on resistance of the lateral SCR, high current operation above 1 amp is permitted with a lateral SCR devices having a reasonable area.

The lateral SCR of the present invention is particularly useful in a monolithic integrated crowbar power supply circuit where current has to be shorted at the output of the power supply when the output voltage exceeds 5 volts. In a lateral SCR structure of the present invention, and having a reasonable amount of area, the on resistance can be reduced to less than 0.1 ohm such that 50 amps can be shorted by the SCR without producing a voltage drop across the SCR in excess of 5 volts. In this manner, the 50 amps of the power supply can be shorted for a short period of time on the order of milliseconds to allow a conventional fuse to blow interrupting the circuit to protect circuit components which cannot receive more than 5 volts without incurring damage thereto.

What is claimed is:

1. In a monolithic lateral silicon controlled rectifier of the type having PNP and NPN transistor portions:
    a silicon semiconductive body having laterally spaced first P, first N, second P, and second N type conductivity regions to define a lateral silicon controlled rectifier semiconductive structure, said first and second P and said second N type regions being embedded in said first N type region; and further said second N type region being embedded in said second P type region said semiconductive member having an N+ type conductivity subcollector layer underlying said P, N, P and N regions in contiguous relation with said first N type region; and said first P type conductivity region including a portion extending below the depth of said second P type region toward said underlying N+ subcollector layer for defining with said N+ subcollector and said second P type region a vertical PNP transistor portion of the silicon controlled rectifier, such vertical PNP transistor portion having a current gain which is relatively small compared to the current gain of the NPN transistor portion and for reducing the anode-to-cathode on resistance of the silicon controlled rectifier structure and the product of the current gains of the PNP and NPN transistor portions of said silicon controlled rectifier being greater than one.

2. The apparatus of claim 1 wherein said first P type region includes an upper portion of lesser conductivity than that of said dependent portion, said lesser conductivity portion being laterally spaced from an adjacent portion of said second P type region via an intervening potion of said first N type region.

3. The apparatus of claim 2 wherein said dependent portion of said first P type conductivity region is of P+ type conductivity.

4. The apparatus of claim 1 wherein said dependent portion of said first P type conductivity region penetrates the depth of said first N type region.

5. The apparatus of claim 1 wherein said first N type conductivity region is an epitaxial layer of said semiconductive body.

6. The apparatus of claim 1 wherein said semiconductive body includes a P type silicon substrate portion underlying said N+ subcollector region incontiguous relation therewith, said N+ subcollector layer comprising an N+ type high conductivity layer having a conductivity within the range of 5 to 20 ohms per square and defining a PN junction with said substrate, said N+ subcollector layer having an impurity concentration which increases toward the N side of said layer.

7. The apparatus of claim 1 wherein said N+ subcollector layer has a depth between 5 and 25 microns and a conductivity between 5 and 50 ohms per square.

8. The apparatus of claim 5 wherein said epitaxial first N type conductivity region has a depth of between 5 and 30 microns and a conductivity of between 0.5 and 5 ohm centimeters.

9. The apparatus of claim 2 wherein said upper portion of said first P type region and said second P type regions have a depth of between 1 and 10 microns and a conductivity between 20 and 400 ohms per square.

10. The apparatus of claim 1 wherein said second N type conductivity region has a depth of between 0.5 and 8.0 microns and a conductivity between 1.0 and 10 ohms per square.

11. The apparatus of claim 6 wherein said P type substrate portion has a depth of between 0.001 and 0.020 inch and a conductivity within the range of 0.5 to 50 ohm centimeters.

* * * * *